(12) United States Patent
Tang et al.

(10) Patent No.: US 11,320,862 B2
(45) Date of Patent: May 3, 2022

(54) DOCKING STATIONS (71) Applicant: Hewlett-Packard Development Company, L.P., Spring, TX (US)

(72) Inventors: Wen-Yen Tang, Taipei (TW); Chang-Han Tsai, Taipei (TW); Sung-Hsueh Tsai, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/046,878

(22) PCT Filed: Aug. 28, 2018

(86) PCT No.: PCT/US2018/048227
§ 371 (c)(1),
(2) Date: Oct. 12, 2020

(87) PCT Pub. No.: WO2020/046271
PCT Pub. Date: Mar. 5, 2020

(65) Prior Publication Data
US 2021/0173441 A1      Jun. 10, 2021

(51) Int. Cl.
*G06F 1/16* (2006.01)
*H05K 5/02* (2006.01)
*H05K 7/14* (2006.01)

(52) U.S. Cl.
CPC ......... *G06F 1/1632* (2013.01); *H05K 5/0247* (2013.01); *H05K 5/0278* (2013.01); *H05K 7/1417* (2013.01)

(58) Field of Classification Search
CPC ........................... Y10S 439/929; H01R 31/06
See application file for complete search history.

(56) References Cited

U.S. PATENT DOCUMENTS

| | | | |
|---|---|---|---|
| 6,196,850 B1* | 3/2001 | Dietz | H01R 39/643 439/17 |
| 6,767,253 B1* | 7/2004 | Werner | H01R 27/00 348/E5.128 |
| 7,035,094 B2 | 4/2006 | Huang et al. | |
| 8,246,367 B2* | 8/2012 | Horiuchi | H01R 13/6485 439/181 |
| 8,512,079 B2* | 8/2013 | Vroom | H01R 13/518 439/639 |
| 8,737,064 B2 | 5/2014 | Son et al. | |
| 9,640,907 B2* | 5/2017 | Kaneko | H01R 13/6275 |
| 10,034,398 B2* | 7/2018 | Kurian | G06F 1/1632 |
| 2002/0081878 A1* | 6/2002 | Bruno | H01R 35/02 439/164 |
| 2003/0111538 A1 | 6/2003 | Cho et al. | |

(Continued)

FOREIGN PATENT DOCUMENTS

| | | |
|---|---|---|
| GB | 2479186 | 5/2010 |
| GB | 2512884 | 10/2014 |

(Continued)

*Primary Examiner* — Xanthia C Cunningham
(74) *Attorney, Agent, or Firm* — Fabian VanCott (57) ABSTRACT

A docking station may include a first communication port to couple the docking station to a target computing device, a rotatable plate, and a fixed plate. The docking station may be rotatably coupled to the target computing device about the first communication port via the rotatable plate and the fixed plate.

20 Claims, 12 Drawing Sheets

(56) References Cited

U.S. PATENT DOCUMENTS

| | | | |
|---|---|---|---|
| 2005/0071290 A1* | 3/2005 | Brooks | G07B 17/00193 |
| | | | 705/401 |
| 2005/0101182 A1* | 5/2005 | Nakamura | G06F 1/1632 |
| | | | 439/529 |
| 2007/0035917 A1* | 2/2007 | Hotelling | H02J 50/10 |
| | | | 361/679.56 |
| 2011/0170256 A1 | 7/2011 | Lee | |
| 2012/0014056 A1 | 1/2012 | Chen et al. | |
| 2013/0198867 A1 | 8/2013 | Ricci et al. | |
| 2014/0168884 A1* | 6/2014 | Wylie | G06F 1/1632 |
| | | | 361/679.43 |
| 2016/0065702 A1* | 3/2016 | Carnevali | H01R 31/06 |
| | | | 455/575.8 |
| 2016/0359285 A1* | 12/2016 | Moore | H01R 24/005 |
| 2017/0062999 A1* | 3/2017 | Thiers | H04M 1/04 |

FOREIGN PATENT DOCUMENTS

| | | |
|---|---|---|
| WO | WO-2012094526 | 7/2012 |
| WO | WO-2016133725 | 8/2016 |
| WO | WO-2018080432 | 5/2018 |

\* cited by examiner

DOCKING STATIONS

BACKGROUND

Computing devices of varying types are ubiquitous throughout the world as tools that increase to carry out sequences of arithmetic or logical operations automatically via computer programming. The ability to carry out processes within a computing device at high speed increases a user's ability to more effectively perform a myriad of tasks. In an example, a computing device may be communicatively coupled to other computing devices for the purpose of sharing data between the computing device and the other computing device or enhancing the capabilities of the computing device through the communicative coupling of the other computing devices.

BRIEF DESCRIPTION OF THE DRAWINGS

The accompanying drawings illustrate various examples of the principles described herein and are part of the specification. The illustrated examples are given merely for illustration, and do not limit the scope of the claims.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In some examples, computing devices may be used in connection with docking stations. A docking station, also referred to as a port replicator or dock, provides a simplified way of "plugging-in" an electronic device such as a tablet-like hybrid console or a laptop computer to peripherals such as computer mice, data storage devices, mobile phone devices, personal digital assistants, other peripheral devices, or combinations thereof. Because a wide range of peripherals include different connectors, power signaling, and uses, the docking station may be designed with a plurality of different connectors to accommodate for these different devices.

A docking station may allow the computing device to become a more highly functional computing device by coupling the peripherals to the computing device via the docking station. As computing devices get smaller and more efficient, docking stations may also change to fit their various form factors. In one example, it may be difficult to create a docking station that can accommodate a tablet computing device, tablet phone, or smart phone device form factor. A tablet computing device form factor includes any mobile computing device that may include a mobile operating system and LCD touchscreen display processing circuitry, along with a rechargeable battery in a single, thin, flat, housing.

Tablet computing devices, being computers, do what other personal computers do, but may lack input/output (I/O) capabilities that other computing devices have. Thus, tablet computing devices may benefit from the expanded capabilities provided via a docking station. Further, many tablet computing devices are used in an upright or inclined orientation and some tablet computing devices may include a kickstand or other buttressing device that keeps the tablet computing device in that orientation.

Examples described herein provide a docking station. The docking station may include a first communication connector to couple the docking station to a target computing device, a rotatable plate, and a fixed plate. The docking station may be rotatably coupled to the target computing device about the first communication connector via the rotatable plate and the fixed plate.

The rotatable plate may include a first hole defined therein, and a set of detents defined in the rotatable plate. The fixed plate may include a second hole defined therein, and a set of protrusions formed on the fixed plate to mate with the detents. The docking station may also include a printed circuit board (PCB), and a plurality of secondary communication ports connected to the PCB to couple a secondary electrical device to the docking station via the secondary communication ports. The first communication port may be a Universal Serial Bus (USB) Type-C port.

The docking station may include a spring to bias the fixed plate in a direction of the rotatable plate. The first hole and the second hole are to receive a communication connector. The communication connector is to mate with the first communication port. Further, the communication connector may be a rigid communication connector to mechanically and rotatably couple the hinged docking station to the target computing device. The docking station may also include a power cable coupled to the docking station to power the PCB.

Examples described herein also provide a system including a docking station. The docking station may include a first communication port, a rotatable plate, and a fixed plate. The system may also include a computing device. The computing device may include a second communication port. The docking station is mechanically and rotatably coupled to the computing device about the first communication port via the rotatable plate and the fixed plate.

The rotatable plate may include a set of detents defined in the rotatable plate. The fixed plate may include a set of protrusions formed on the fixed plate to mate with the detents. The system may also include a printed circuit board (PCB), a second communication port to couple the docking station to the computing device, and a set of tertiary communication ports coupled to the PCB to couple a secondary electrical device to the computing device via the docking station.

The rotatable plate may include a first hole defined therein. The fixed plate may include a second hole defined therein. The first hole and the second hole are to receive a communication connector. The communication connector is to mate with the first communication port and the second communication port to enter therethrough. The system may also include a power cable coupled to the docking station to power the PCB.

Examples described herein also provide a docking station. The docking station may include a communication connector to mate a first communication port located on the docking station to a second communication port located on a computing device, a rotatable plate, a fixed plate, a set of detents defined in the rotatable plate, and a set of protrusions formed on the fixed plate to mate with the detents. The docking station is rotatably coupled to the computing device via the rotatable plate and the fixed plate and the mating of the detents and the protrusions.

The rotatable plate may include a first hole defined therein. The fixed plate may include a second hole defined therein. The docking station may include a spring to bias the fixed plate in a direction of the rotatable plate. The first hole and the second hole are to receive the communication connector. The communication connector is to mate with the first communication port to enter therethrough.

Figure 1:
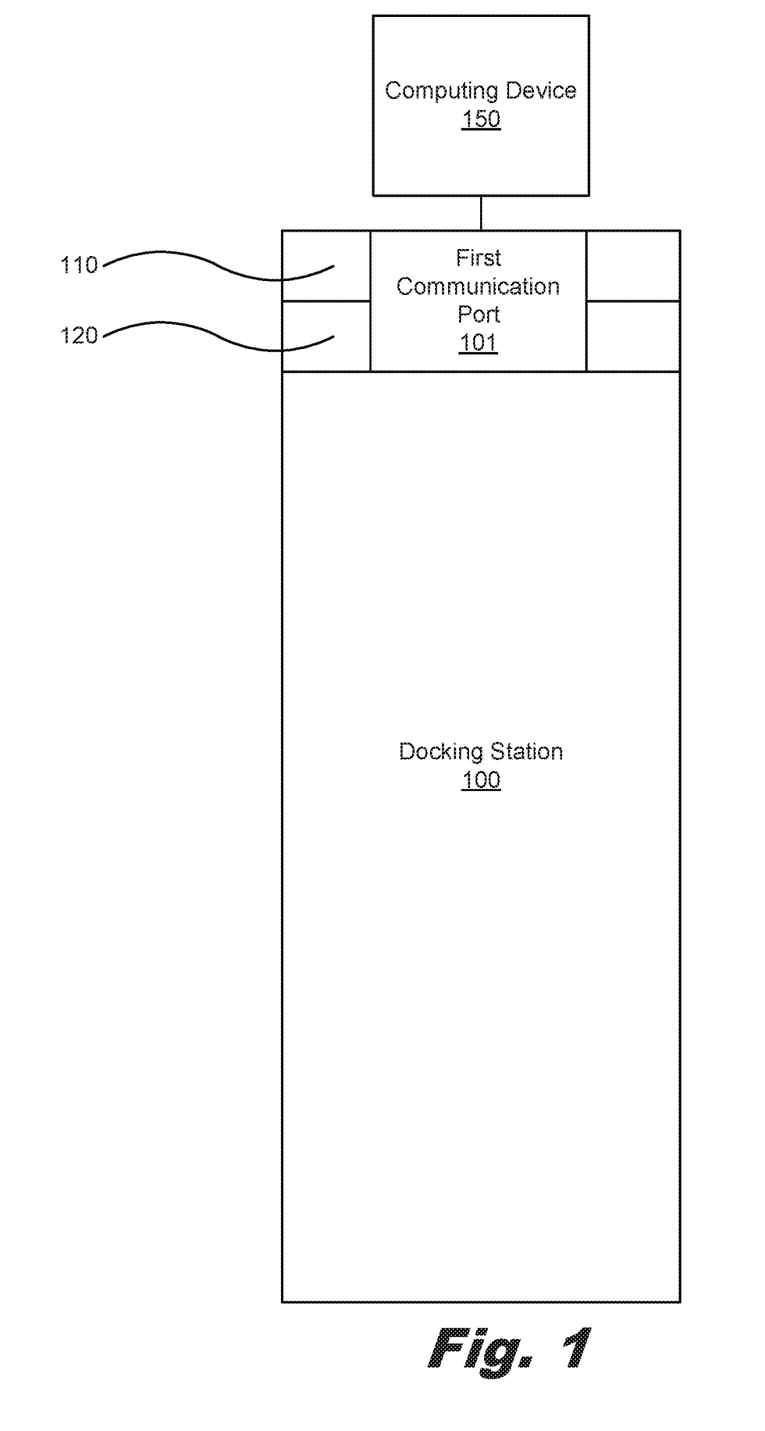
FIG. 1 is a block diagram of a docking station, according to an example of the principles described herein.

Turning now to the figures, FIG. 1 is a block diagram of a docking station (100), according to an example of the principles described herein. The docking station (100) may be used in conjunction with a computing device (150) such as, for example, a tablet computing device. The computing device (150) may be any type of computing device to which the docking station (100) may be coupled, and may include, for example, a tablet computing device, a tablet phone, a smart phone device, a personal digital assistant, a laptop computing device, or any other type of tablet form factor computing device.

The computing device (150) may be mechanically, electrically, and communicatively coupled to the docking station (100) via a first communication connector. The docking station (100) serves as both a device through which additional devices may be communicatively coupled to the computing device (100), but also as a kickstand that orients the computing device (100) in an upright or inclined orientation.

The docking station (100) may include a rotatable plate (110) and a fixed plate (120). The docking station (100) may also include a first communication port (101) that allows for a male connector from the computing device (150) to couple to the docking station (100). The rotatable plate (110), fixed plate (120), and first communication port (101) assist in rotating the docking station (100) relative to the computing device (150) to angle the docking station (100) with respect to the computing device (150). The docking station (100) is rotatably coupled to the computing device (150) about the first communication port (101) via the rotatable plate (110) and the fixed plate (120).

In the examples described herein, as the rotatable plate (110) and the first communication port (101) rotate relative to the fixed plate (120) and the remainder of the docking station (100), the docking station (100) may be angled with respect to the computing device (150). In other words, the rotatable plate (110) and the first communication port (101) remain stationary with respect to the computing device (150) as the fixed plate (120) and the remainder of the docking station (100) rotate about the pivot formed by the rotatable plate (110) and the first communication port (101).

Figure 2:
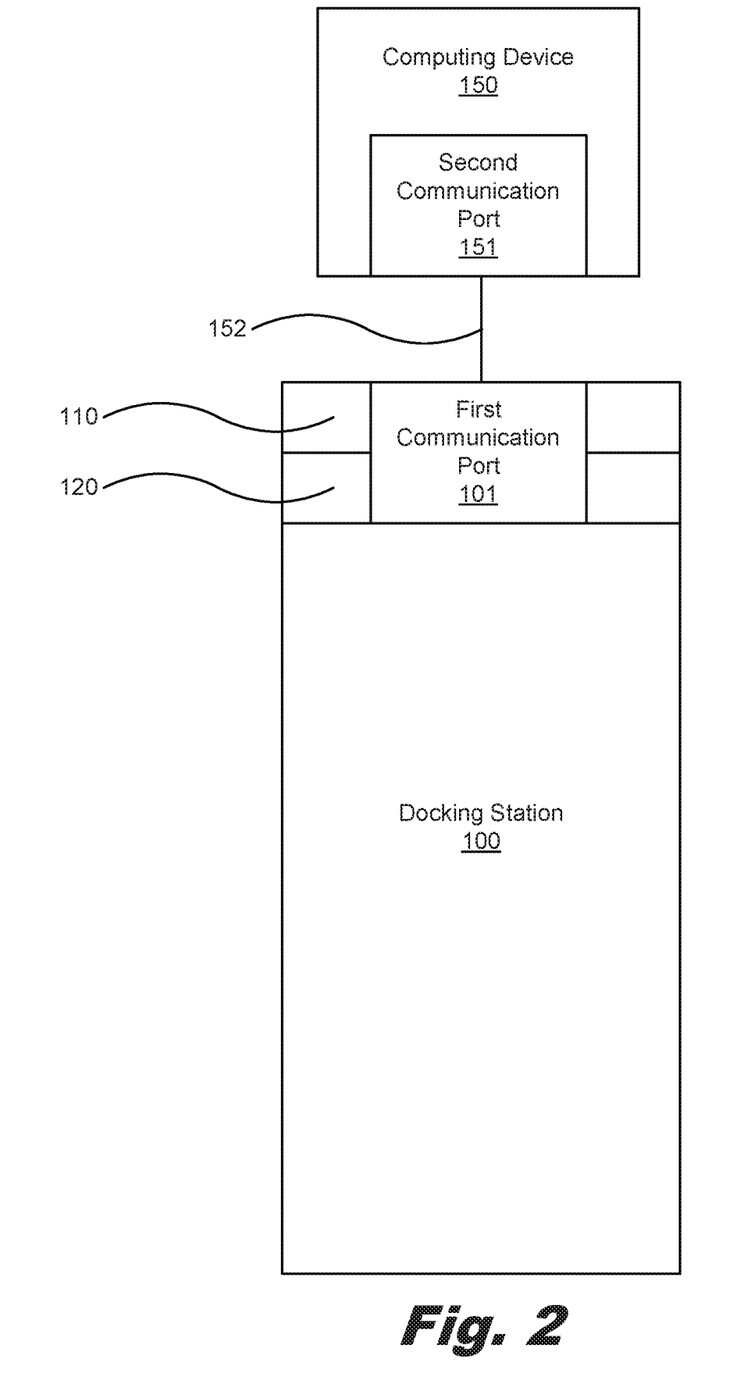
FIG. 2 is a block diagram of a docking station, according to an example of the principles described herein.

FIG. 2 is a block diagram of a docking station (100), according to an example of the principles described herein. The example of FIG. 2 includes elements that are identical to elements found in the docking station of FIG. 1, and description of those elements is provided herein in connection with FIG. 1. The example of FIG. 2 further includes a second communication port (151) included as part of the computing device (150). The second communication port (151) serves to mate with a male connector that physically, electrically, and communicatively couples the computing device (150) to the docking station (100). The connection between the computing device (150) and the docking station (100) is identified in FIG. 2 as connection (152).

In an example, connection (152) is a universal serial bus (USB) Type-C type connection, although any type of communication standard and form factor may be included. A USB-C connection includes power and data transmission pins that provide electrical power and communication capabilities between the docking station (100) and the computing device (150), respectively. In this manner, the docking station (100) may provide electrical power to the computing device (150) as well as allow peripheral devices coupled to the docking station (100) to transmit data to and receive data from the computing device (150) via the docking station (100). Thus, the docking station (100) enhances the capability of the computing device (150) by supply power and extra data transmission capabilities.

In an example, the connection (152) between the docking station (100) and the computing device (150) may be a rigid adaptor that does not include a wired portion. In this manner, the rigid connection (152) serves as a pivot about which the docking station (100) may rotate relative to the computing device (150). Inclusion of a wired portion would allow the connection (152) to turn with the turning of the docking station (100) relative to the computing device (150), and would not allow for the rotatable plate (110) to rotate with the connection (152) relative to the fixed plate (120) and the remaining elements of the docking station (100).

In the examples described herein, the connection (152) may be built as an integral part of the docking station (100) or may be a removable as a separate adaptor. Further, in the examples described herein, the connection (152) may be a male-to-male, a male-to-female, a female-to-male, or a female-to-female connection, and the corresponding form of the first communication port (101) and the second communication port (151) may have a corresponding form factor. The examples described herein, however, will be described as if the connection (152) is a male-to-male connection and the corresponding first communication port (101) and the second communication port (151) being female connections.

Figure 3:
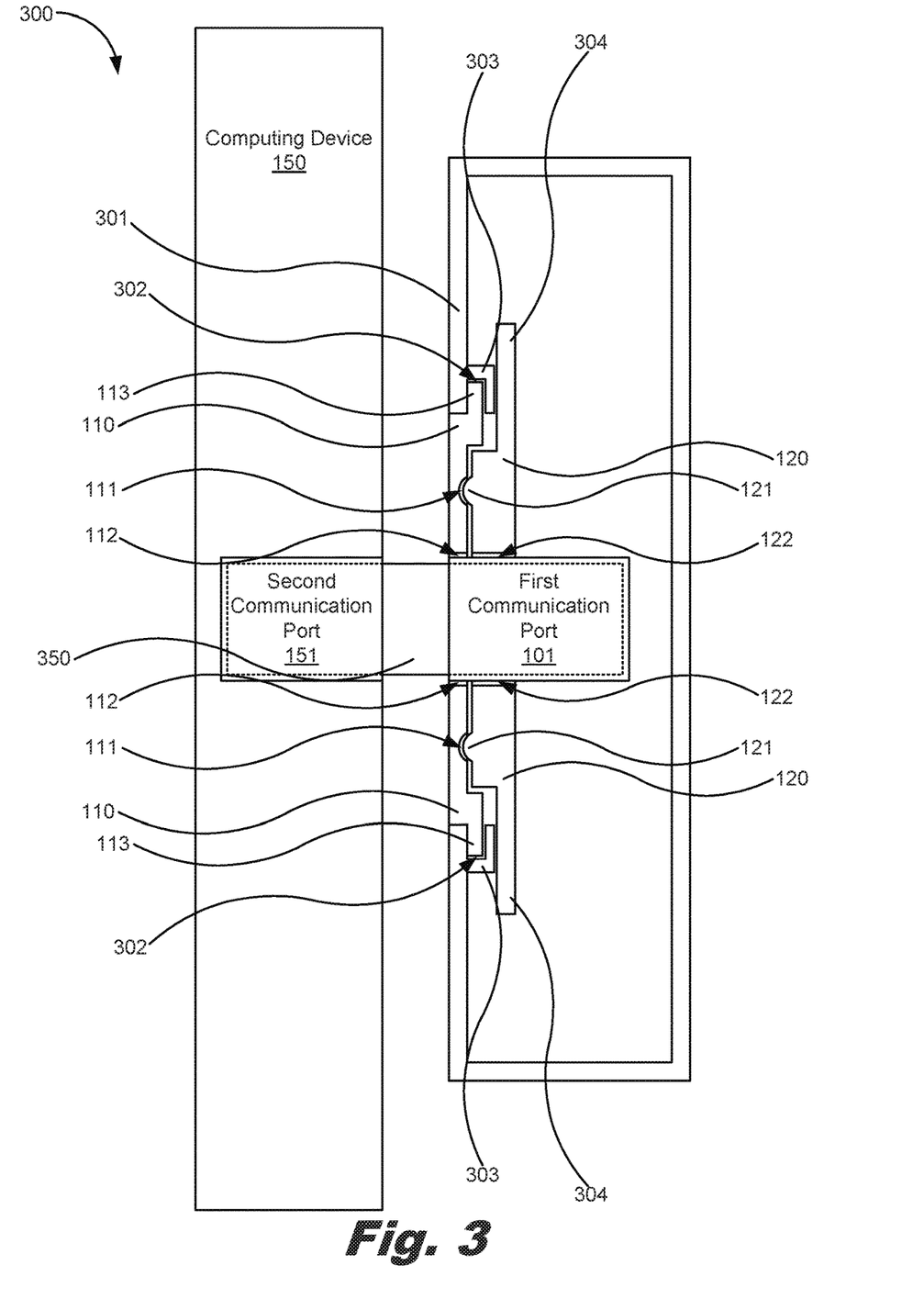
FIG. 3 is a block diagram of a system including a docking station, according to an example of the principles described herein.

FIG. 3 is a block diagram of a system (300) including a docking station (100), according to an example of the principles described herein. As depicted in FIG. 3, the computing device (150) may include a single, thin, flat, form factor, and may be coupled to the docking station (100) via the first communication port (101), the second communication port (151), and an adaptor (350) that serves as the connection (FIG. 2, 152) between the docking station (100) and the computing device (150). Sizes of elements within the drawings are not necessarily to scale, and although the width of the docking station is depicted as being somewhat similar to the width of the computing device (150), the docking station (100) may actually be significantly thinner than the computing device (150) and is depicted in an increased size to show details of the docking station (100).

Figure 5A:
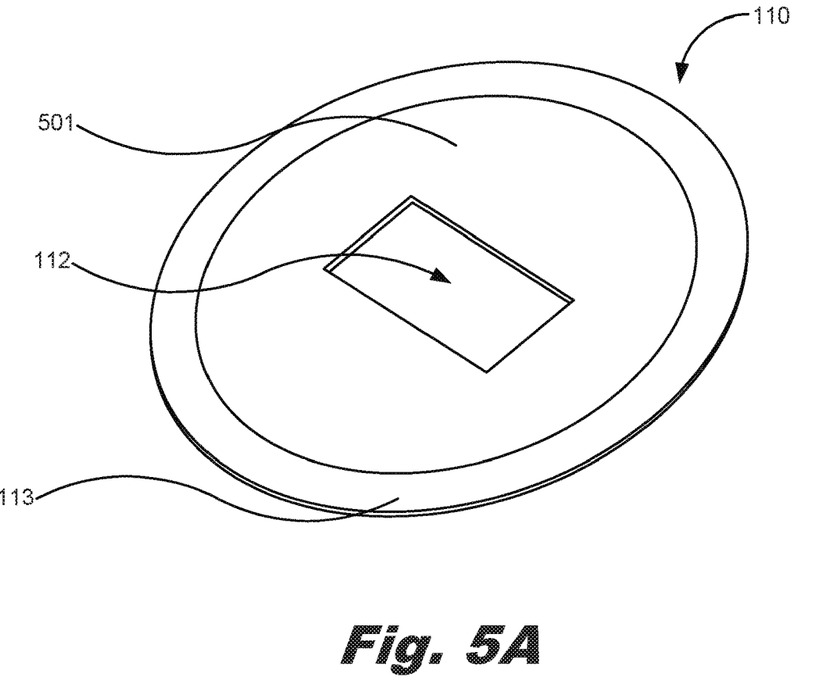
FIG. 5A is a perspective view of a first side of a rotatable plate, according to an example of the principles described herein.
Figure 5B:
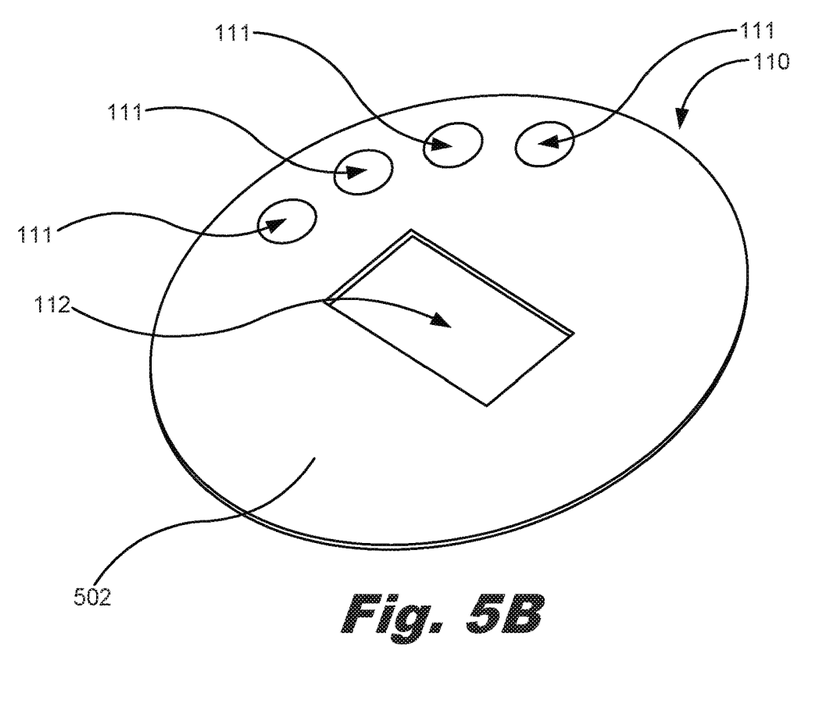
FIG. 5B is a perspective view of a second side of a rotatable plate, according to an example of the principles described herein.
Figure 6A:
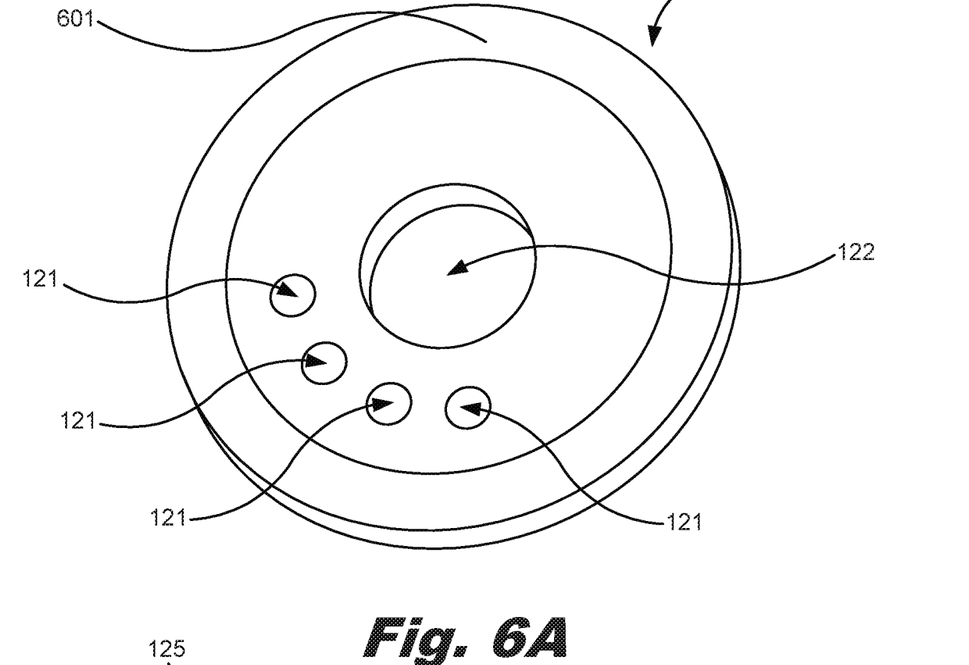
FIG. 6A is a perspective view of a first side of a fixed plate, according to an example of the principles described herein.
Figure 6B:
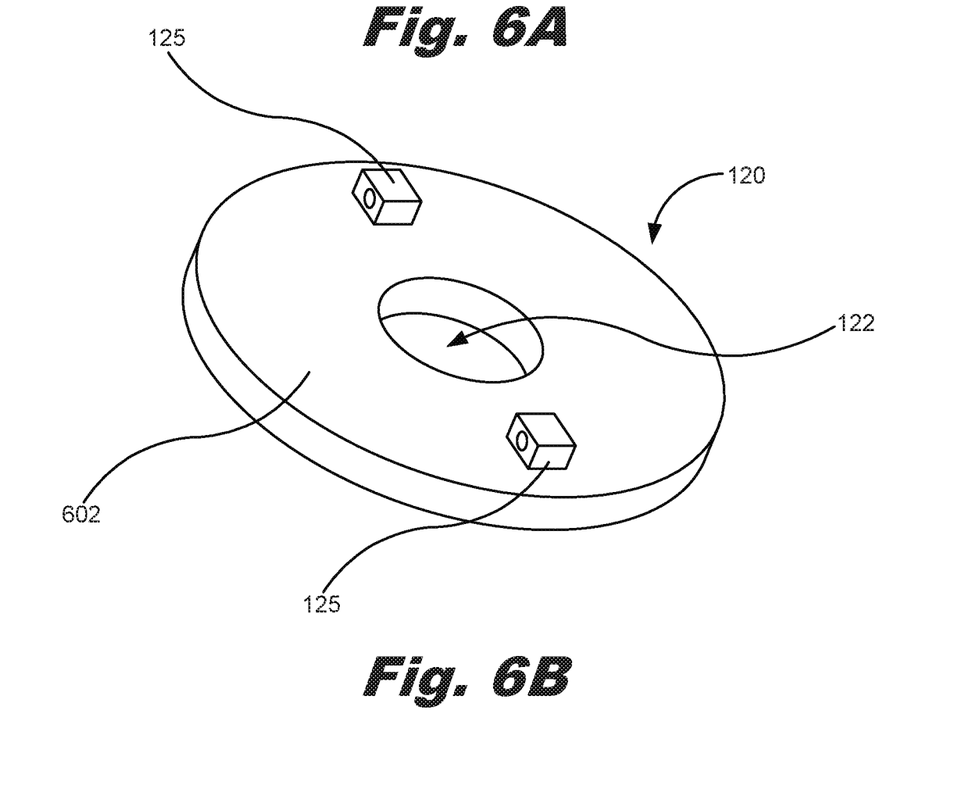
FIG. 6B is a perspective view of a second side of a fixed plate, according to an example of the principles described herein.

The docking station (100) includes a housing (300), the rotatable plate (110), and the fixed plate (120). The rotatable plate (110) may include a number of detents (111) defined therein, and the fixed plate (120) may include a number of protrusions (121) formed thereon that mate with the detents (111). The detents (111) and protrusions (121) are depicted in FIGS. 5B and 6A. FIG. 5A is a perspective view of a first side (501) of the rotatable plate (110), according to an example of the principles described herein. FIG. 5B is a perspective view of a second side (502) of a rotatable plate (110), according to an example of the principles described herein. Further, FIG. 6A is a perspective view of a first side (601) of the fixed plate (120), according to an example of the principles described herein, and FIG. 6B is a perspective view of a second side (602) of the fixed plate (120), according to an example of the principles described herein. With reference to FIGS. 3, 5B and 6A, the rotatable plate (110) rotates relative to the fixed plate (120), and as these two elements rotate relative to one another, the detents (111) of the rotatable plate (110) and the protrusions (121) of the fixed plate (120) engage and disengage. The engagement and disengagement of the detents (111) and the protrusions (121) creates a situation where the angle of the docking station (100) relative to the computing device (150) may be positioned at discrete angles defined by the positioning of the detents (111) and protrusions (121) on the rotatable plate (110) and fixed plate (120), respectively. In the examples depicted in FIGS. 5B and 6A, four detents (111) and four protrusions (121) are depicted. However, any number of detents (111) and protrusions (121) may be included on the rotatable plate (110) and fixed plate (120). For example, the number of detents (111) and the protrusions (121) may include enough detents (111) and protrusions (121) to create a ring of detents (111) and the protrusions (121) around the rotatable plate (110) and fixed plate (120) such that the docking station (100) may revolve about the pivot formed by the rotatable plate (110), first communication port (101) and adaptor (350) relative to the computing device (150).

The housing (301) may include a retention bracket (303) that creates a retention void (302) into which a tapered fringe (FIGS. 3, 4, 5A, 113) of the rotatable plate (110) may be inserted. The housing (301) may include two halves or portions that allow for the circular rotatable plate (110) to be inserted into the retention bracket (303). In this manner, the adaptor (350), the first communication port (101), and the rotatable plate (110) remain stationary with respect to the second communication port (151) of the computing device (150) as the housing (301) and fixed plate (120) are allowed to rotate.

Referring to FIGS. 3, 5A, 5B, 6A and 6B, the rotatable plate (110) includes a first void (112) defined therein and the fixed plate (120) includes a second void (122) defined therein. The first void (112) and the second void (122) provide a space into which the adapter (350) and the first communication port (101) may seat. The first void (112) defined in the rotatable plate (110) is square in shape and is dimensioned to fit a square form factor adaptor (350). In an example, the first void (112) may include any shape that matches the shape and form factor adaptor (350) so that the rotatable plate (110) rotates with the adaptor (350) when the docking station (100) is pivoted with respect to the computing device (150). The second void (122) defined in the fixed plate (120), in contrast, includes a circular shape that allows the fixed plate (120) to freely rotate around the first communication port (101). In an example, the diameter of the circular second void (122) may be large enough to allow for the largest dimension of the first communication port (101) to fit in the second void (122) so that the fixed plate (120) may freely rotate around the first communication port (101).

Figure 4:
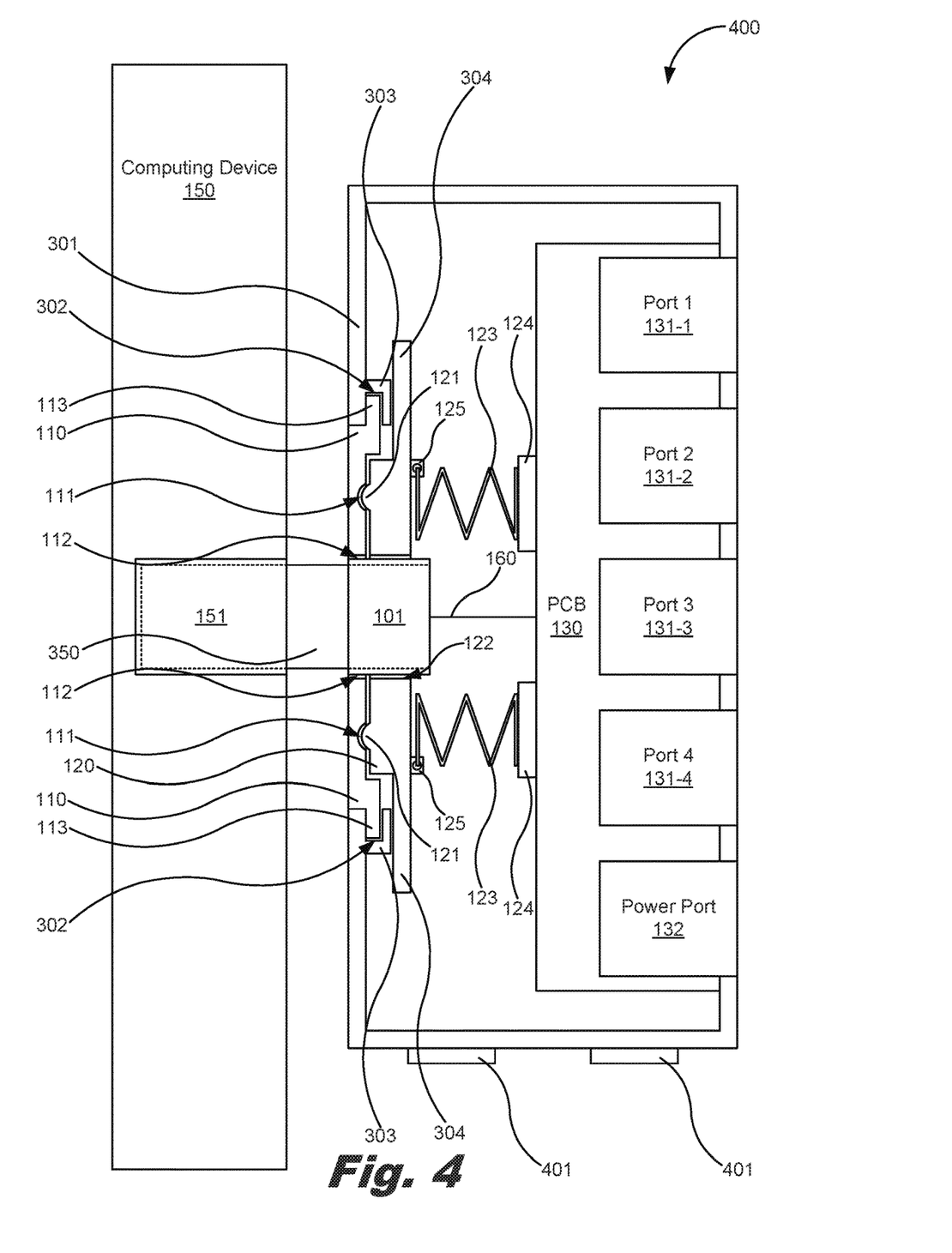
FIG. 4 is a block diagram of a system including a docking station, according to an example of the principles described herein.

FIG. 4 is a block diagram of a system (400) including a docking station, according to an example of the principles described herein. The system (400) of FIG. 4 includes several elements described herein in connection with, for example, FIG. 3. The system of FIG. 4 further includes a printed circuit board (PCB) (130) communicatively and electrically coupled to the first communication port (101) via a data transmission line (160). The PCB (130) may include electrical and logical circuitry that couples a number of ports (131-1, 131-2, 131-2, 131-4, referred to hereinafter as 131) and a power port (132) to the PCB (130) and the computing device (150) via the first communication port (101), the second communication port (151), and adaptor (350). The power port (132) may provide power from, for example, a wall socket to the PCB (130) of the docking station (100), the computing device (150), a battery of the computing device (150), other connected devices, and combinations thereof for use as a power source and/or to charge rechargeable batteries of the connected devices.

The ports (131) may be any type of connector that may be used to transmit data and provide I/O capabilities between the computing device (150) and any peripheral device that may be coupled to the computing device (150) via the docking station (100). The ports (131) may include, for example, USB connectors, serial port connectors, parallel port connectors, IEEE 1394 (i.e., FireWire) connectors, IEEE 802.3 (i.e., Ethernet), musical instrument digital interface (MIDI) connectors, PCI Express connectors, DisplayPort connectors, Thunderbolt connectors, optical fiber connectors, high-definition multimedia interface (HDMI) connectors, RJ45 connectors, other types of communication interfaces, and combinations thereof. The ports (131) serve as a set of tertiary communication ports coupled to the PCB to couple a number of secondary electrical devices to the computing device (150) via the docking station (100).

The docking station (100) may also include a number of springs (123). The springs are mechanically coupled to the PCB (130) using blocks (124) that are coupled to both the springs (123) and an edge of the PCB (130). The springs (123) are coupled to the bottom of the fixed plate (120) using spring hooks (125). In an example, the springs (125) are compression springs biased to operate with a compression load so that the springs (123) get shorter as the load is applied to them. In this example, the springs (123) create a force against the fixed plate (120) at a location of the protrusions (121) formed on the fixed plate (120) and the detents (111) defined in the rotatable plate (110) in order cause the detents (111) and protrusions (121) to engage one another until the force applied by the springs (123) is overcome. This provides a snap engagement function between the detents (111) and protrusions (121) so that as user of the docking station (100) may tactilely sense the engagement and disengagement of the detents (111) and protrusions (121) as the user rotates the docking station (100) relative to the computing device (150).

Turning again to FIGS. 3, 4, and 6A, the fixed plate (120), like the rotatable plate (110), includes a tapered fringe (304). A number of feet (401) may also be included on the housing (301). The feet (401) may be included so that the docking station (100) may also serve as a kickstand for the computing device (150) as the docking station (100) is rotated with respect to the computing device (150).

As is apparent from FIG. 4 and other figures, the data transmission line (160) is subjected to twisting as the docking station (100) rotates about the pivot formed by the rotatable plate (110) and the first communication port (101). In an example and in order to ensure that the data transmission line (160) does not fail due to material fatigue from rotation of the docking station (100), the data transmission line (160) may include a length of cable that couples the first communication port (101) to the PCB (130) that allows for the cable to twist without compromising any soldering or other coupling processes or devices used to couple the data transmission line (160) to the first communication port (101) and the PCB (130).

Figure 7:
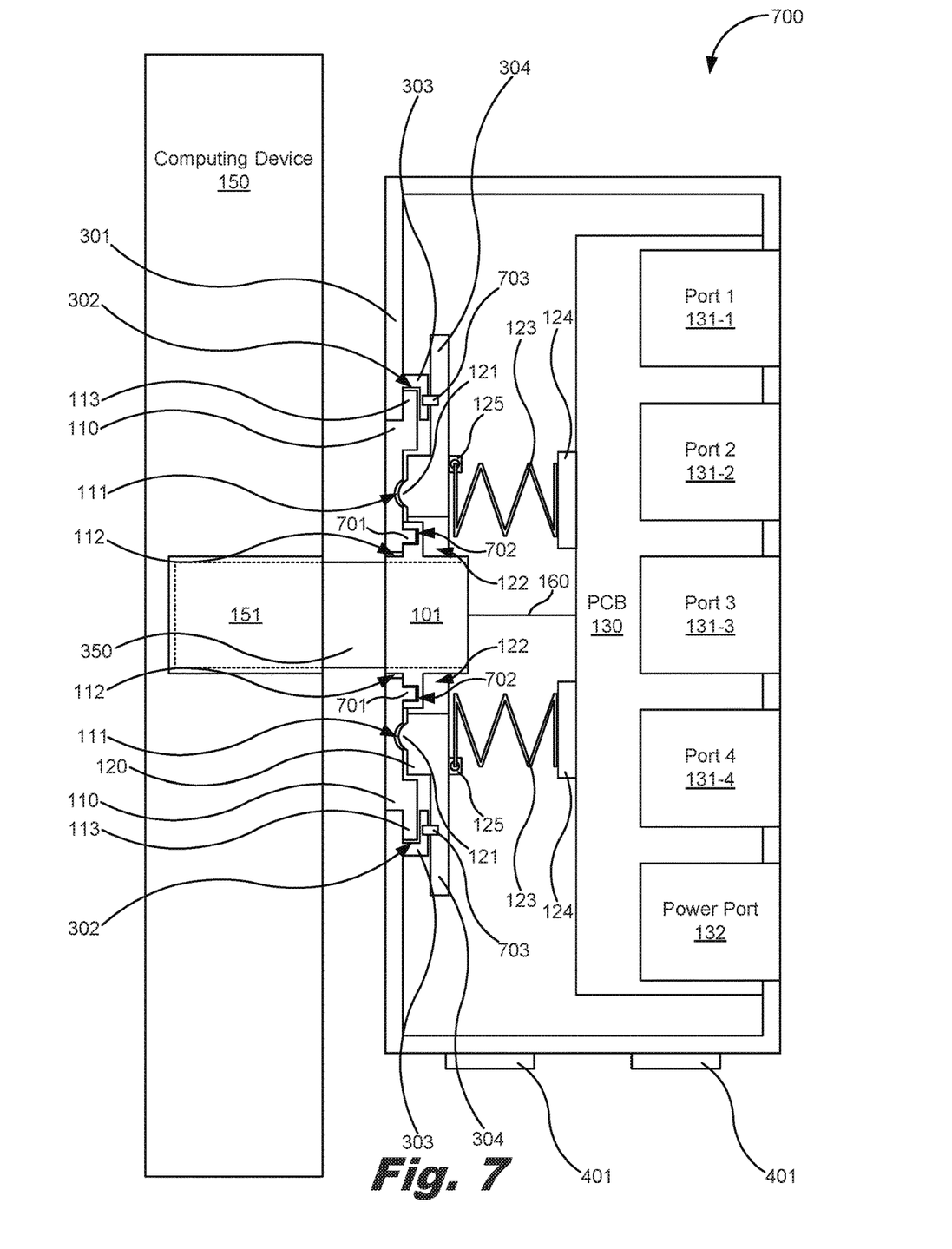
FIG. 7 is a block diagram of a system including a docking station, according to an example of the principles described herein.
Figure 8A:
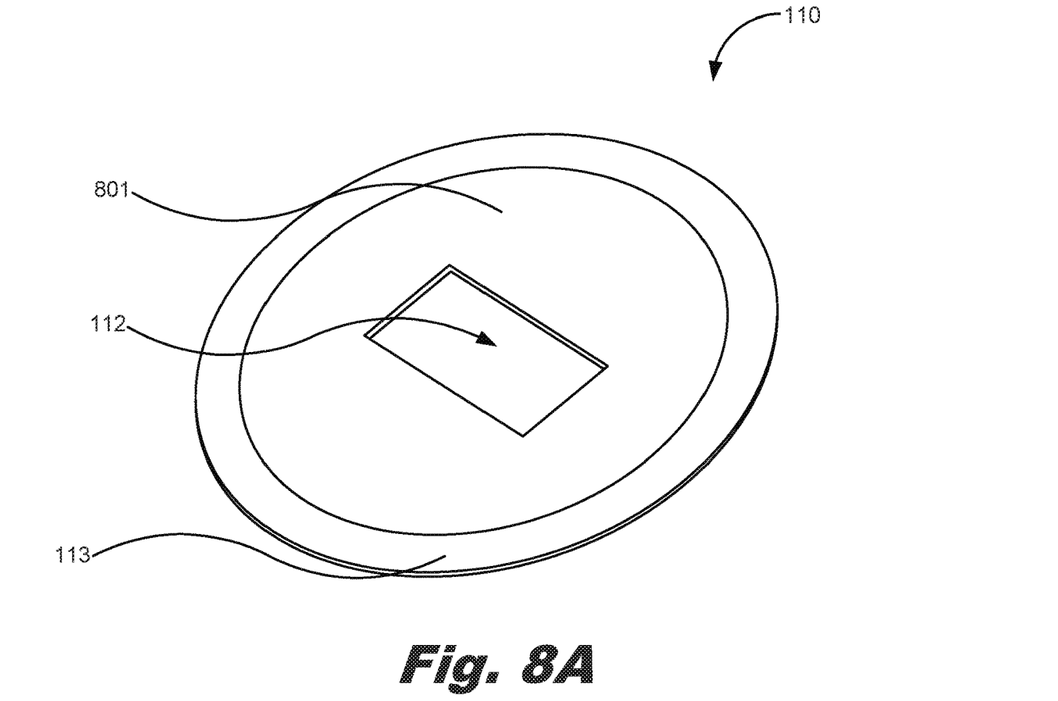
FIG. 8A is a perspective view of a first side of a rotatable plate, according to an example of the principles described herein.
Figure 8B:
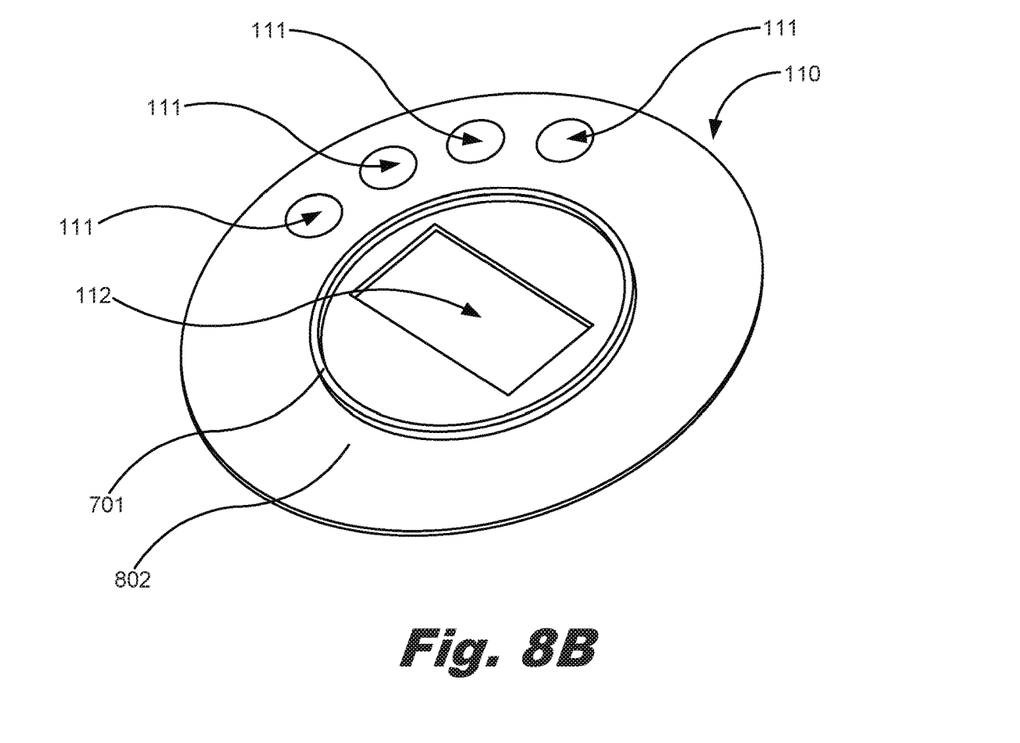
FIG. 8B is a perspective view of a second side of a rotatable plate, according to an example of the principles described herein.
Figure 9A:
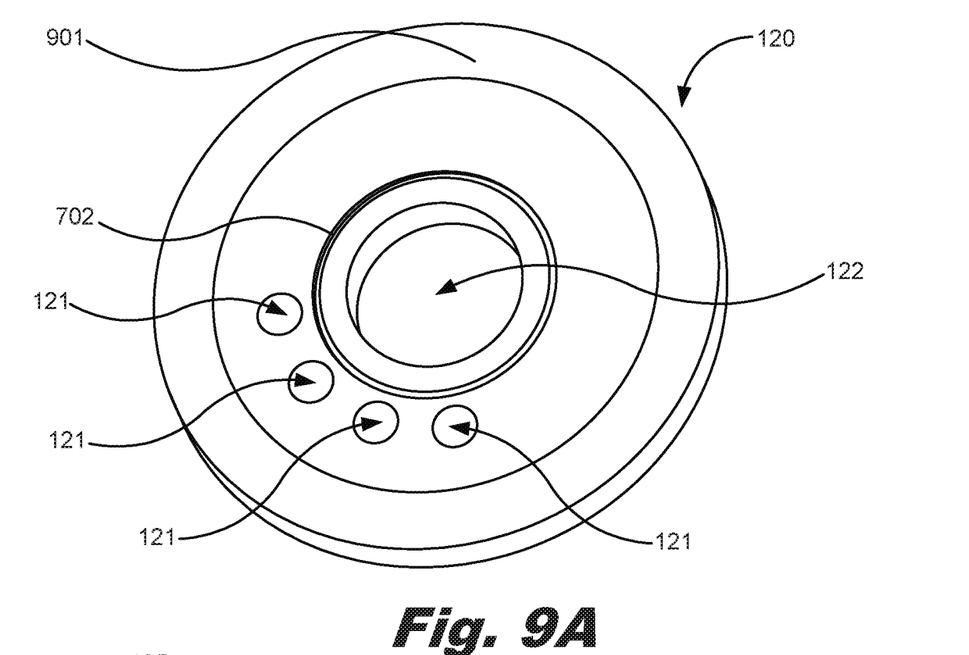
FIG. 9A is a perspective view of a first side of a fixed plate, according to an example of the principles described herein.
Figure 9B:
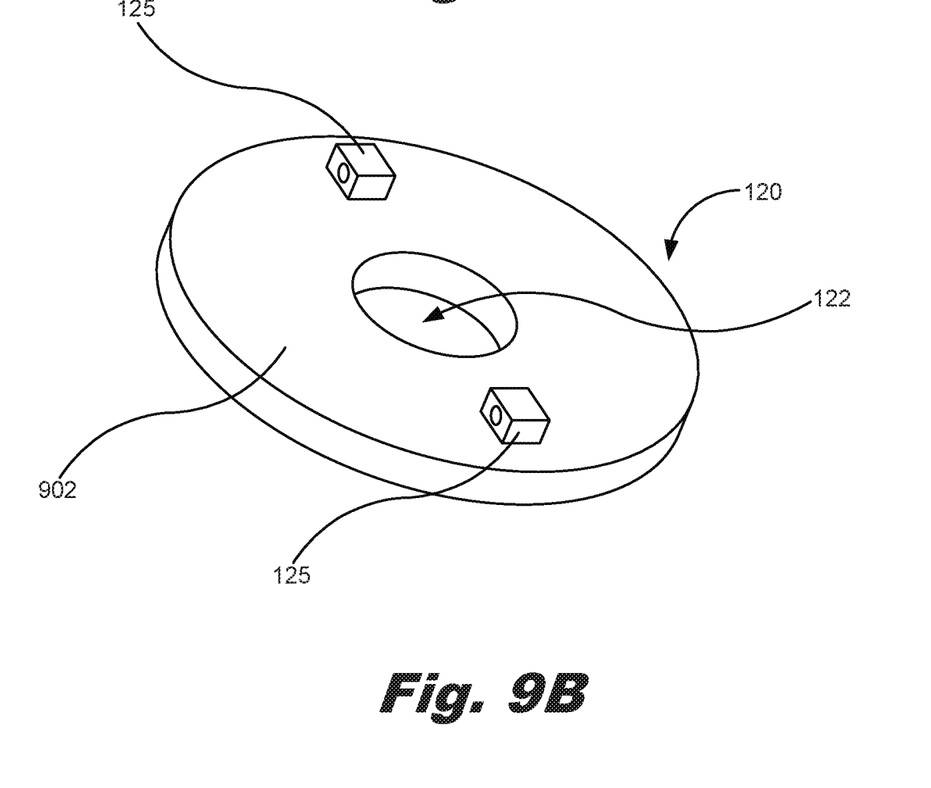
FIG. 9B is a perspective view of a second side of a fixed plate, according to an example of the principles described herein.

FIG. 7 is a block diagram of a system (700) including a docking station (100), according to an example of the principles described herein. The example of FIG. 7 may include the elements of the examples of FIGS. 1 through 6 and description of these elements is provided herein. Further, FIG. 8A is a perspective view of a first side (801) of a rotatable plate (110), according to an example of the principles described herein, and FIG. 8B is a perspective view of a second side (801) of the rotatable plate (110), according to an example of the principles described herein. Still further, FIG. 9A is a perspective view of a first side (901) of a fixed plate (120), according to an example of the principles described herein, and FIG. 9B is a perspective view of a second side (902) of the fixed plate (120), according to an example of the principles described herein.

Figure 10A:
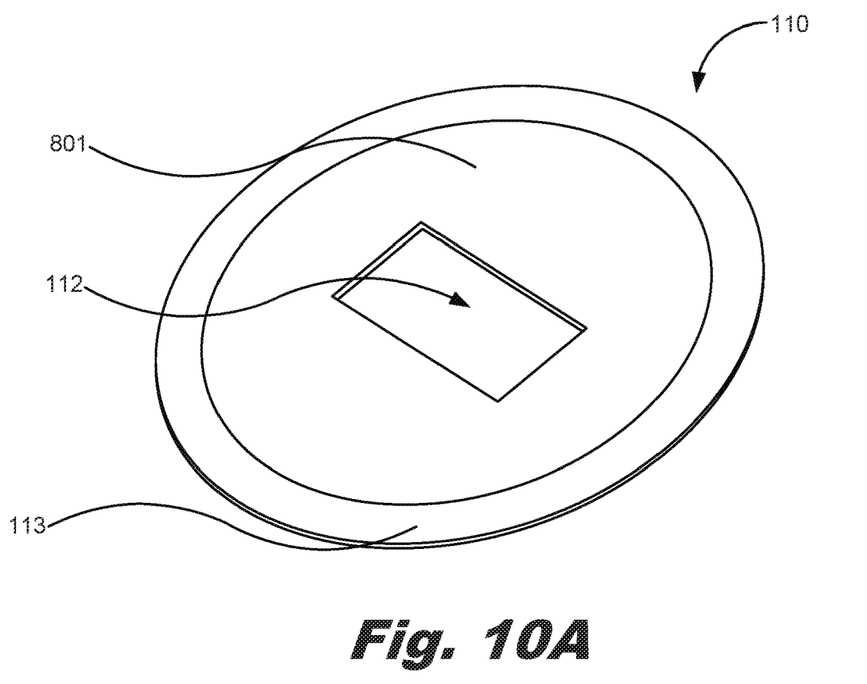
FIG. 10A is a perspective view of a first side of a rotatable plate, according to an example of the principles described herein.
Figure 10B:
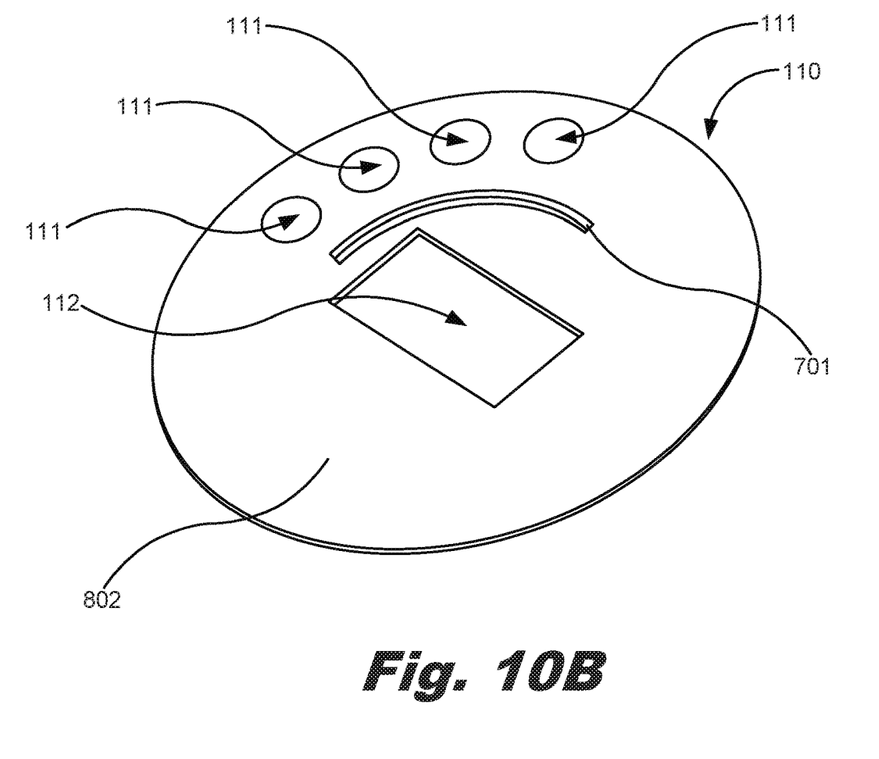
FIG. 10B is a perspective view of a second side of a rotatable plate, according to an example of the principles described herein.
Figure 11A:
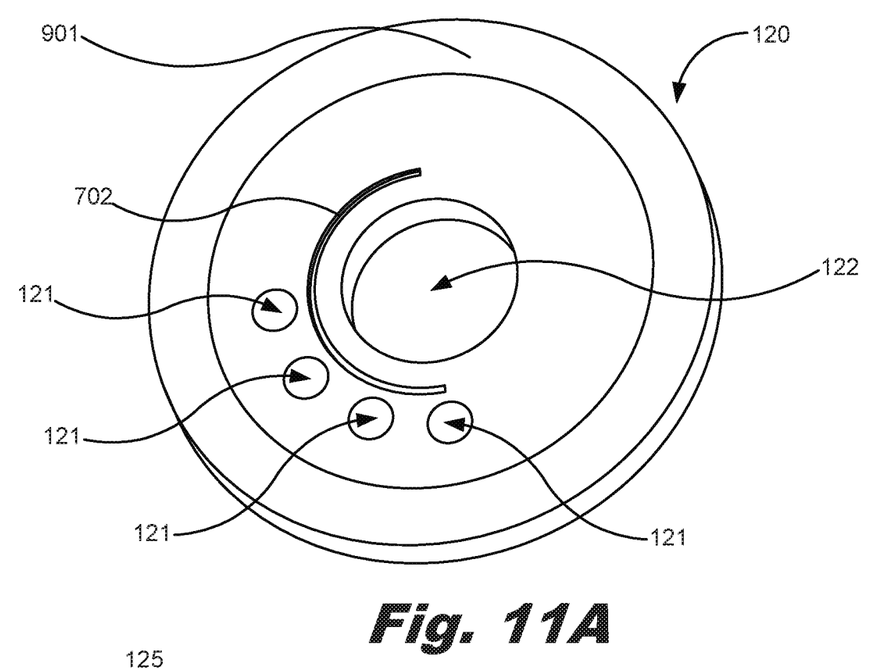
FIG. 11A is a perspective view of a first side of a fixed plate, according to an example of the principles described herein.
Figure 11B:
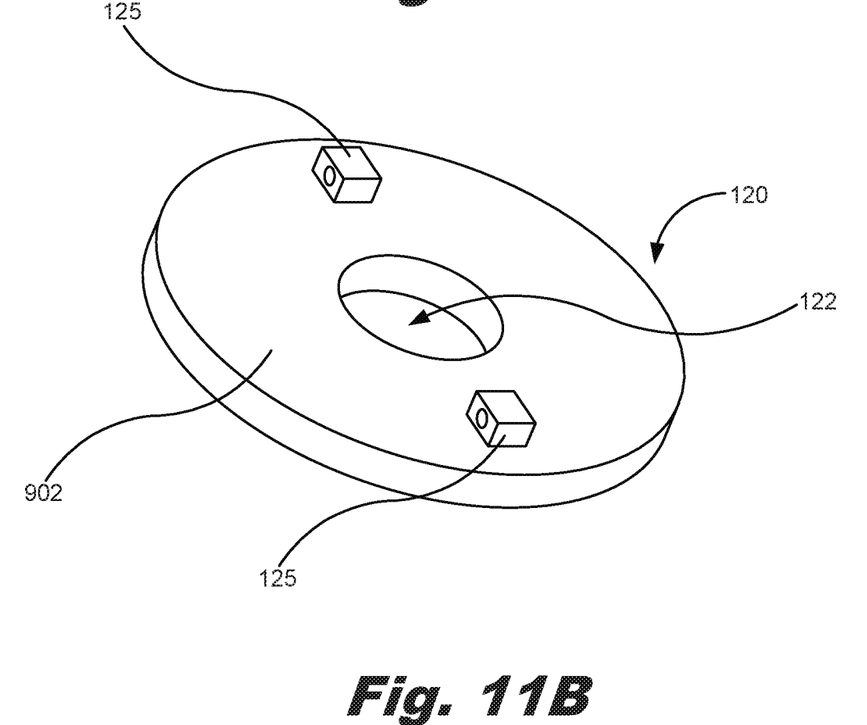
FIG. 11B is a perspective view of a second side of a fixed plate, according to an example of the principles described herein.

FIGS. 10a through 11B include another example of the rotatable plate (110) and the fixed plate (120). FIG. 10A is a perspective view of a first side (801) of a rotatable plate (110), according to an example of the principles described herein, and FIG. 10B is a perspective view of a second side (802) of the rotatable plate (110), according to an example of the principles described herein. Further, FIG. 11A is a perspective view of a first side (901) of a fixed plate (120), according to an example of the principles described herein, and FIG. 11B is a perspective view of a second side (902) of a fixed plate (120), according to an example of the principles described herein. The example of FIGS. 7 and 10A through 11B include a rail (701) formed on the rotatable plate (110) and a mating channel (702) defined on the fixed plate (120). The rail (701) and channel (702) serve to align the rotatable plate (110) and the fixed plate (120) relative to one another during operation. In one example, the rail (701) and/or channel (702) may not be formed in a complete circle such as depicted in FIGS. 10B and 11A, respectively. In this example, the rail (701) may extend, for example, along a quarter circle, and the channel (702) may extend, for example, along a half circle. In this manner, the rail (701) may travel along the channel (702) the distance of the quarter circle as restricted by the rail (701) itself, but within the boundary set by the channel (702). Thus, the rail (701) and channel (702) in this example serve as a stop at which point the docking station (100) can no longer rotate about the pivot formed by the rotatable plate (110) and the first communication port (101). This restricts the rotation of the docking station (100) relative to the computing device (150) such that the docking station (100) cannot rotation about one revolution, but is restricted to a portion of a revolution.

The docking station (100) of FIG. 7 may also include a bridge (703) that mechanically couples the fixed plate (120) to the housing (301). By coupling the fixed plate (120) to the housing (301), the docking station (100) may be made more sturdy through the coupling of parts together.

Figure 12:
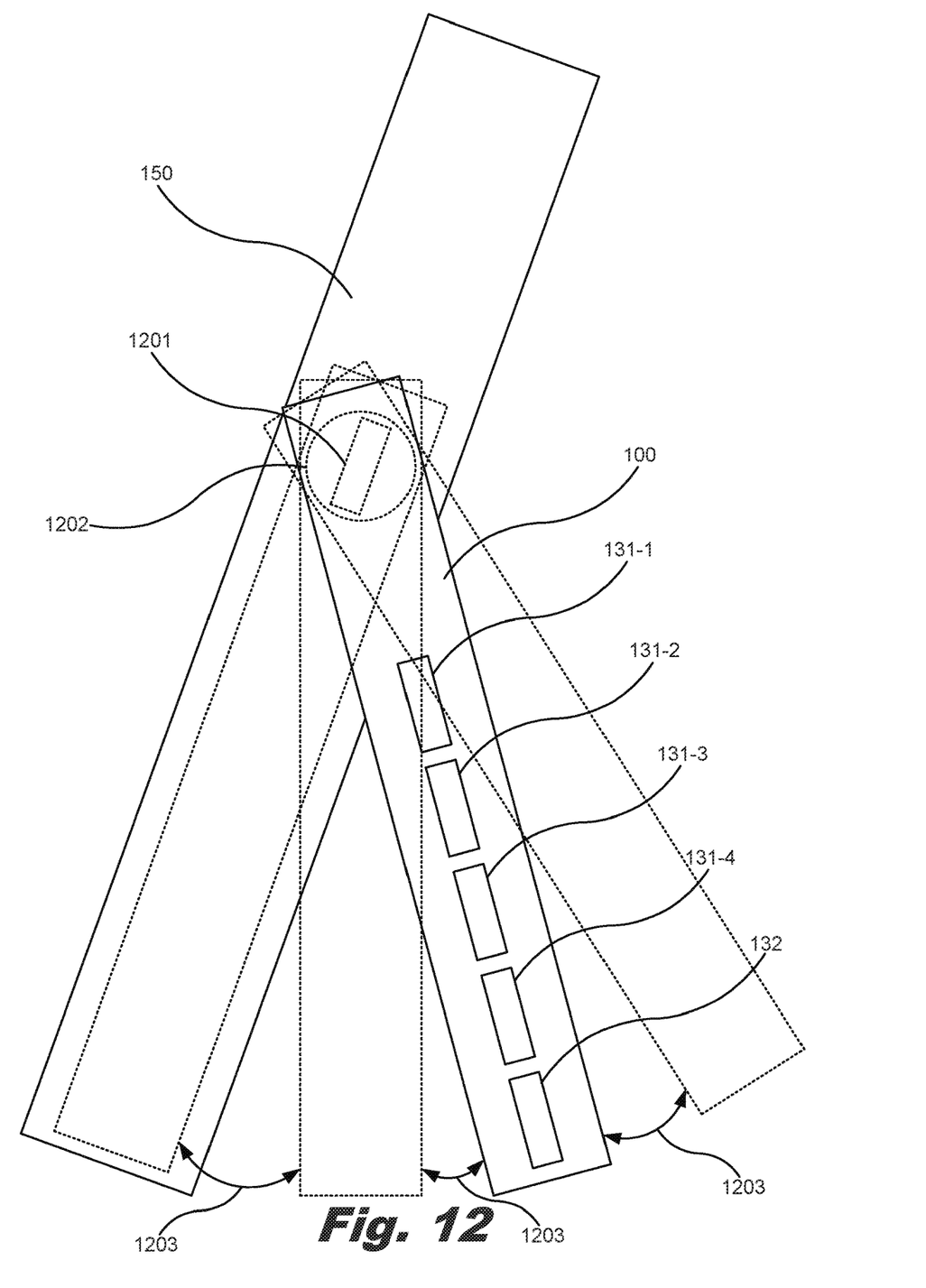
FIG. 12 is a block diagram of a system including a docking station, according to an example of the principles described herein.

FIG. 12 is a block diagram of a system (1200) including a docking station (100), according to an example of the principles described herein. As depicted in FIG. 12, the docking station (100) is coupled to the computing device (150) via an adaptor (350) that couples between the first communication port (101) located on the docking station (100) and the second communication port (151) located on the computing device (150). Box 1201 indicates the mechanical, electrical, and communication coupling between the adaptor (350), the first communication port (101), and the second communication port (151). Circle 1202 of FIG. 12 indicates the rotatable plate (110) and the fixed plate (120) that rotate relative to one another in order to allow the docking station (100) pivot about the rotatable plate (110) and the first communication port (101). The ports (131) and power port (132) are also depicted along a length of the docking station (100).

Arrows 1203 indicate the discrete angles at which the docking station (100) may be rotated about circle (1202) based on the detents (111) defined in the rotatable plate (110) and the protrusions (121) formed on the fixed plate (120). Although four angles of the docking station (100) are depicted in FIG. 12, any number of discrete angles may be provided based on the number of the detents (111) defined in the rotatable plate (110) and the protrusions (121) formed on the fixed plate (120) and their spacing relative to one another. As the docking station (100) pivots to another angle, the computing device (150) is inclined at a different angle as well allowing for a viewing angle by a user to be selected in this manner.

The specification and figures describe a docking station. The docking station may include a first communication connector to couple the docking station to a target computing device, a rotatable plate, and a fixed plate. The docking station may be rotatably coupled to the target computing device about the first communication connector via the rotatable plate and the fixed plate. The docking station provides for the ability to support a computing device through the kickstand functionality of the docking station while providing for an electrical and communicative coupling of peripheral computing devices and other computing devices to the computing device. Further, the coupling of the docking station via ports of the computing device provide for a clean, unobstructed cover of the computing device while still providing for a kickstand and communication and power coupling functions of the computing device in contrast to a kickstand that may be otherwise coupled to a back of the computing device and does not provide the functionality of the docking station described herein. Further, the docking station reduces the number of cables and wires used to couple the computing device to other peripheral computing devices and other computing devices by removing at least one redundant cable that would otherwise be used to couple the docking station to the computing device. Further, the docking station is portable along with the computing device such that its inclusion in a system along with the computing device provides communication and electrical support to the computing device in a small package.

The preceding description has been presented to illustrate and describe examples of the principles described. This description is not intended to be exhaustive or to limit these principles to any precise form disclosed. Many modifications and variations are possible in light of the above teaching.

What is claimed is:

1. A docking station, comprising:
   a first communication port to couple the docking station to a target computing device;
   a fixed plate,
   a rotatable plate that is rotatable with respect to the fixed plate;
   wherein the docking station is rotatable with respect to the target computing device about the first communication port via the rotatable plate and the fixed plate to change an angle between the docking station and target computing device.

2. The docking station of claim 1, wherein:
   the rotatable plate comprises:
      a first hole defined therein; and
      a set of detents defined in the rotatable plate, and
   the fixed plate comprises:
      a second hole defined therein; and
      a set of protrusions formed on the fixed plate to mate with the detents.

3. The docking station of claim 1, comprising:
   a printed circuit board (PCB); and
   a plurality of secondary communication ports connected to the PCB to couple a secondary electrical device to the docking station via the secondary communication ports.

4. The docking station of claim 1, wherein the first communication port is a Universal Serial Bus (USB) Type-C port.

5. The docking station of claim 2, comprising a spring to bias the fixed plate in a direction of the rotatable plate.

6. The docking station of claim 2, wherein:
   the first hole and the second hole are to receive a communication connector, wherein the communication connector is to mate with the first communication port, and
   wherein the communication connector is a rigid communication connector to mechanically and rotatably couple the docking station to the target computing device.

7. The docking station of claim 3, comprising a power cable coupled to the docking station to power the PCB.

8. A system, comprising:
   a docking station, the docking station comprising:
      first communication port;
      a rotatable plate; and
      a fixed plate; and
   a computing device comprising a second communication port,
   wherein the docking station is mechanically and rotatably coupled to the computing device about the first communication port via the rotatable plate and the fixed plate.

9. The system of claim 8, wherein:
   the rotatable plate comprises a set of detents defined in the rotatable plate; and
   the fixed plate comprises a set of protrusions formed on the fixed plate to mate with the detents.

10. The system of claim 8, comprising:
    a printed circuit board (PCB);
    a second communication port to couple the docking station to the computing device; and
    a set of tertiary communication ports coupled to the PCB to couple a secondary electrical device to the computing device via the docking station.

11. The system of claim 10, wherein:
    the rotatable plate comprises a first hole defined therein,
    the fixed plate comprises a second hole defined therein, and
    the first hole and the second hole are to receive a communication connector, wherein the communication connector is to mate with the first communication port and the second communication port to enter therethrough.

12. The system of claim 10, comprising a power cable coupled to the docking station to power the PCB.

13. A docking station, comprising:
    a first communication port; and
    a communication connector to mate the first communication port to a second communication port located on a computing device;
    a rotatable plate;
    a fixed plate;
    a set of detents defined in the rotatable plate; and
    a set of protrusions formed on the fixed plate to mate with the detents,
    wherein the docking station is rotatably coupled to the computing device via the rotatable plate and the fixed plate and the mating of the detents and the protrusions.

14. The docking station of claim 13, wherein:
    the rotatable plate comprises a first hole defined therein;
    the fixed plate comprises a second hole defined therein, and
    the docking station comprises a spring to bias the fixed plate in a direction of the rotatable plate.

15. The docking station of claim 14, wherein the first hole and the second hole are to receive the communication connector, wherein the communication connector is to mate with the first communication port to enter therethrough.

16. The docking station of claim 1, wherein the docking station comprises a foot or feet to contact a same surface as the target computing device to provide a kickstand for supporting the target computing device when coupled to the first communication port.

17. The docking station of claim 1, wherein the rotatable plate and the first communication port are stationary with respect to the target computing device while the fixed plate and a remainder of the docking station are rotatable about a pivot formed by the rotatable plate and first communication port.

18. The docking station of claim 1, further comprising a removable adaptor as part of the first communication port to adapt to connection with the target computing device.

19. The docking station of claim 1, further comprising a retention bracket having a retention void into which a tapered fringe of the rotatable plate is received while permitting relative rotation.

20. The docking station of claim 1 further comprising a rail formed on the rotatable plate and a corresponding mating channel on the fixed plate to guide relative rotation.

* * * * *